United States Patent [19]
Economy et al.

[11] Patent Number: 5,816,481
[45] Date of Patent: Oct. 6, 1998

[54] PIN BLOCK METHOD OF DISPENSING SOLDER FLUX ONTO THE I/O PADS OF AN INTEGRATED CIRCUIT PACKAGE

[75] Inventors: Kenneth Walter Economy, Escondido; Ronald Allen Norell, Oceanside; Richard Leigh Bumann, Olivenhain, all of Calif.

[73] Assignee: Unisys Corporation, Blue Bell, Pa.

[21] Appl. No.: 789,218

[22] Filed: Jan. 24, 1997

[51] Int. Cl.⁶ .............................. B23K 1/20; B23K 31/02
[52] U.S. Cl. ............................................ 228/207; 228/223
[58] Field of Search .................................. 228/203, 207, 228/223

[56] References Cited

U.S. PATENT DOCUMENTS 5,676,305  10/1997  Potter et al. ............................. 228/207

OTHER PUBLICATIONS

"Automatic Flux Applicator," *IBM Tech. Discl. Bull.,* vol. 34, No. 2, Jul. 1991, pp. 356–357.

*Primary Examiner*—Patrick Ryan
*Assistant Examiner*—Jeffrey T. Knapp
*Attorney, Agent, or Firm*—Charles J. Fassbender; Mark T. Starr; Steven R. Petersen

[57] ABSTRACT

Multiple I/O pads are arranged in a pattern on a surface of an integrated circuit package, and an obstruction in the package prevents a planer solder flux mask from lying flat on the surface around the I/O pads. Such an obstruction can, for example, be a lid in the package which projects above the I/O pads, or it can be an encapsulant which covers a chip in the package and projects above the I/O pads. Despite the presence of the obstruction, solder flux is dispensed on the I/O pads of the integrated circuit package by the steps of —a) providing a pin block that has a base from which multiple pins project, and the ends of the pins match the pattern of the I/O pads; b) coating the ends of the pins with a solder flux; and, c) transferring a portion of the solder flux from the ends of the pins to the I/O pads by temporarily touching the coated ends of the pins against the I/O pads. During this transferring step, the coated ends of the pins are moved past the obstruction and touched against the I/O pads without touching the obstruction.

13 Claims, 7 Drawing Sheets

PIN BLOCK METHOD OF DISPENSING SOLDER FLUX ONTO THE I/O PADS OF AN INTEGRATED CIRCUIT PACKAGE

CROSS REFERENCE TO RELATED APPLICATIONS

VIBRATING TEMPLATE METHOD OF PLACING SOLDER BALLS ON THE I/O PADS OF AN INTEGRATED CIRCUIT PACKAGE (Docket 550,575—now Ser. No. 08/789,217—which was co-filed with the present Docket 550,574—now Ser. No. 08/789,218).

BACKGROUND OF THE INVENTION

This invention relates to the field of integrated circuit packages; and more particularly, it relates to methods of dispensing solder flux onto the I/O pads of an integrated circuit package and subsequently placing solder balls onto those flux covered I/O pads.

In the prior art, many types of integrated circuit packages exist. Typically, an integrated circuit package has a rectangular shaped body which is relatively thin and flat. Each side of the body of the package is usually about one to three inches long, and the body thickness usually is about one quarter inch.

Housed within the body portion of the integrated circuit package is one or more integrated circuit chips. This is achieved by providing a cavity within the body of the integrated circuit package and placing the chip or chips in that cavity. Thereafter, the cavity is covered with a lid or is filled with an encapsulant such as an epoxy.

Also included in the prior art integrated circuit packages are multiple I/O terminals (input/output terminals). These terminals usually extend from one surface of the integrated circuit package, and they provide a means by which electrical signals are sent to and received from each integrated circuit chip which is housed within the body of the package.

In one type of integrated circuit package, the I/O terminals are structured as a plurality of metal pins. This type of integrated circuit package is called a pin grid array package. To mount several pin grid array packages on a substrate, such as a printed circuit board, respective plated metal holes are provided through the substrate for each pin in the pin grid array packages; and the pins are soldered into the holes.

In another more recent type of integrated circuit package, I/O terminals are structured as an array of solder balls. This type of integrated circuit package is commonly called a ball grid array package. To mount several ball grid array packages on a substrate, such as a printed circuit board, respective flat metal contacts are provided on the surface of the substrate for each solder ball on the ball grid array packages; and the balls are soldered to those contacts. Thus, the need to form and plate respective holes through the substrate for all of the I/O terminals on the integrated circuit package is eliminated.

In the prior art, solder balls have been attached to the integrated circuit package by the following steps. Initially, respective metal I/O pads were formed on the surface of the integrated circuit package at the locations where the solder balls were to be attached. Then, a planer mask was placed flat on that surface, and the mask had openings which exposed each of the I/O pads. Next, solder flux was pushed through each of the openings onto the I/O pads, and then the mask was removed. Thereafter, an automatic pick and place machine would pick solder balls from a supply and place them onto the I/O pads, one at a time. Then, the solder balls on the I/O pads were melted and resolidified.

However, one problem with the above-described fabrication process is that it is inherently slow. This is because the pick and place machine can only put one solder ball at a time onto the I/O pads; and, several hundred I/O pads are often on a single integrated circuit package.

Another problem with the above process is that the automatic pick and place machine is very expensive. Depending on its sophistication and operating speed, a pick and place machine sells for about $100,000 to $400,000.

Also, another problem with the above process is that it will only work for those particular types of integrated circuit packages which have no obstruction to the I/O pads. If the I/O pads are obstructed, then the planer mask cannot lie flat on the surface of the package. Thus the solder flux, which is pushed through the mask can bridge two or more the I/O pads; and that can cause a short circuit.

Accordingly, a primary object of the invention is to provide an improved process in which the above problems are overcome.

BRIEF SUMMARY OF THE INVENTION

With the invention which is herein claimed, solder flux can be dispensed onto multiple I/O pads which are arranged in a pattern on a surface of an integrated circuit package, even when the that package includes an obstruction which prevents a planer mask from lying flat on the surface around the I/O pads. Such an obstruction can, for example, be a lid in the package which projects above the I/O pads, or it can be an encapsulant which covers a chip in the package and projects above the I/O pads. In accordance with the claimed invention, solder flux is dispensed on the I/O pads of the integrated circuit package by the steps of —a) providing a pin block that has a base from which multiple pins project, and the ends of the pins match the pattern of the I/O pads; b) coating the ends of the pins with a solder flux; and, c) transferring a portion of the solder flux from the ends of the pins to the I/O pads by temporarily touching the coated ends of the pins against the I/O pads. During this transferring step, the coated ends of the pins are moved past the obstruction and touched against the I/O pads without touching the obstruction. Also, another feature of the claimed invention is that the I/O pads can be located in respective recesses on the surface of the integrated circuit package; and those recesses can be partially filled with solder flux by moving the coated ends of the pins into the recesses and touching them against the I/O pads. Thereafter, solder balls can be placed into the partially filled recesses; and these recess will prevent the solder balls from rolling off of the I/O pads until the solder balls are reflowed.

DETAILED DESCRIPTION

Figure 1:
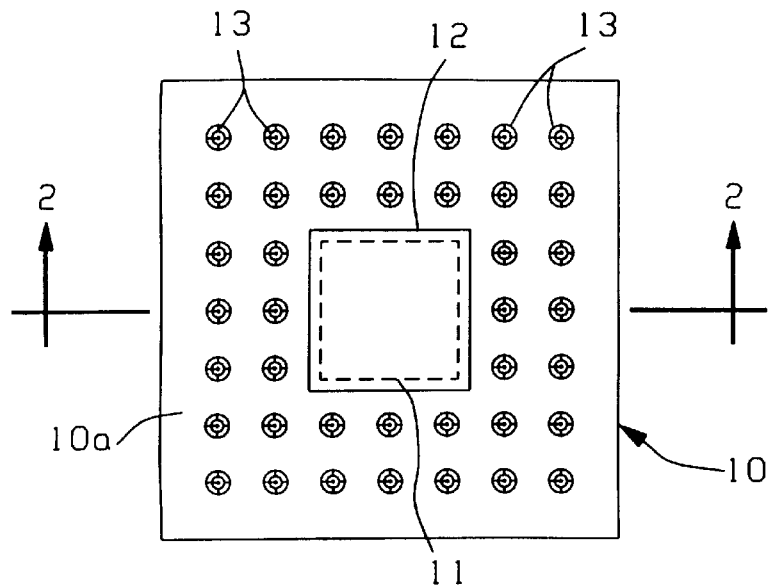
FIG. 1 is a top view of an integrated circuit package which will be processed, as shown in the subsequent figures, in accordance with the present invention.
Figure 2:
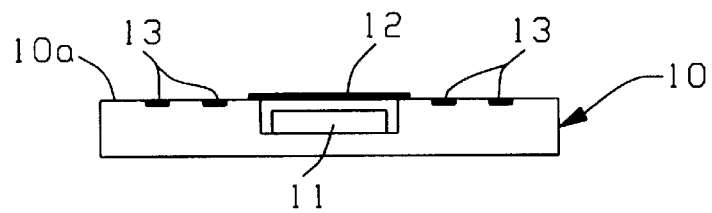
FIG. 2 is a sectional view of the FIG. 1 integrated circuit package which is taken along the section line 2—2 in FIG. 1.

In FIGS. 1 and 2, reference numeral 10 identifies an integrated circuit package which is to be processed by the present invention. As shown in those figures, the integrated circuit package 10 includes an integrated circuit chip 11 which lies in a cavity in the body of the package, and that cavity is covered by a lid 12. In one actual embodiment of the package 10, the body is comprised of laminated ceramic layers; and the lid 11 is metal.

Multiple metal I/O pads (input/output pads) 13 lie on a surface 10a of the integrated circuit package 10 and surround the lid 12. Each I/O pad 13 is connected by a respective microscopic conductor in the package body to a corresponding I/O terminal on the integrated circuit chip 11. Due to their small size, these conductors are not shown in FIGS. 1 and 2, but two of these conductors are shown in FIG. 3 as item 14.

In the above-referenced actual embodiment of the integrated circuit package 10, the diameter of each I/O pad 13 is 0.025 inches; the I/O pads have a center-to-center spacing of 0.050 inches; and the total number of I/O pads 13 is 524. Thus, the I/O pads 13 as drawn in FIGS. 1 and 2 are greatly reduced in total number and increased in size in order to simplify those drawings.

Now, starting with the integrated circuit package of FIGS. 1 and 2, the processes which are performed in accordance with the present invention are —a) the dispensing of solder flux onto each of the I/O pads 13, and b) the subsequent placing of solder balls onto those flux-covered I/O pads. How these processes are performed in accordance with the present invention is illustrated in FIGS. 3–19.

Figure 3:
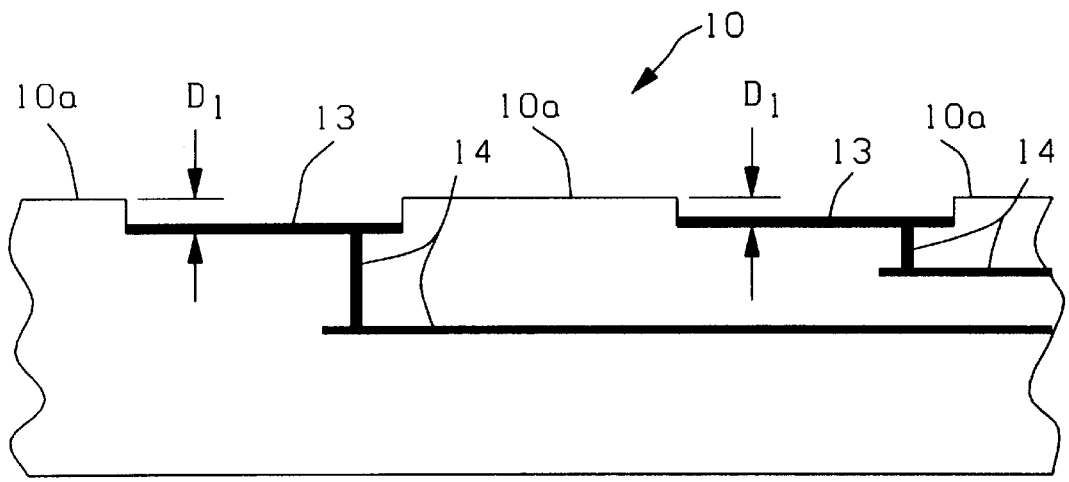
FIG. 3 is a greatly enlarged view of a portion of the FIG. 2 section which encompasses two I/O pads.

Initially, as is shown in FIG. 3, each of the I/O pads 13 is formed in a respective recess on surface 10a of the integrated circuit package 10. By these recesses, the solder balls which will subsequently be placed on the I/O pads 13 are prevented from rolling into each other. If any two solder balls are able to roll into each other, then the integrated circuit chip 11 will not operate properly because two I/O terminals on the chip 11 will be shorted together.

Preferably, each of the I/O pads 13 is recessed from surface 10a of the integrated circuit package 10 by a depth $D_1$ which is at least ½0th of the diameter of the solder balls that are to be placed on the I/O pads. In the above-referenced actual embodiment, the solder balls had a diameter of 0.030 inches; and the I/O pads 13 were recessed 0.003 inches.

Figure 4:
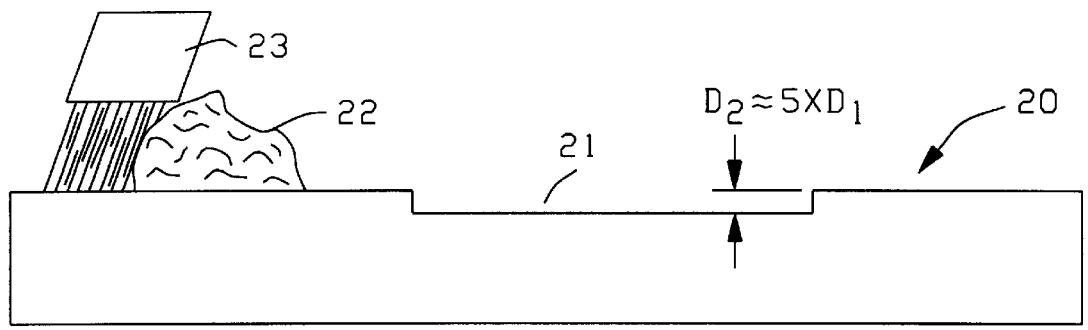
FIG. 4 shows a stencil which is used to hold solder flux for the I/O pads of the FIG. 1 integrated circuit package.
Figure 5:
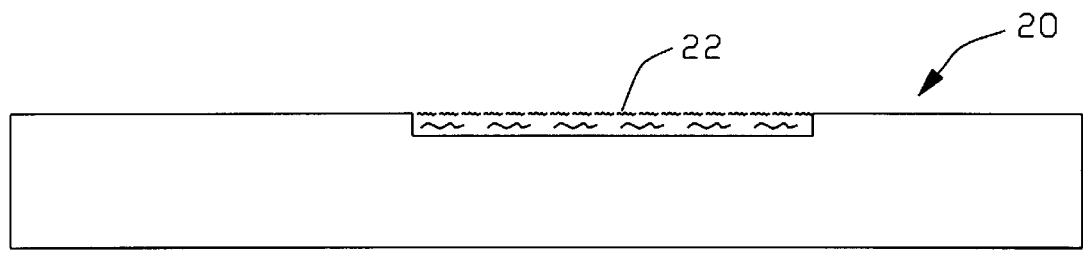
FIG. 5 shows a step in which the FIG. 4 stencil is filled with solder flux.

Next, as is shown in FIG. 4, a stencil 20 is provided which has an indentation 21 that is wide enough to encompass all of the I/O pads 13 of the integrated circuit package 10 and which has a uniform depth $D_2$. Thereafter, as is shown in FIG. 5, the indentation 21 in the stencil 20 is completely filled with solder flux 22. This is achieved by using the squeegee 23 in FIG. 4 to push the mound of the solder flux 22 into the indentation 21 and remove the excess.

Figure 6:
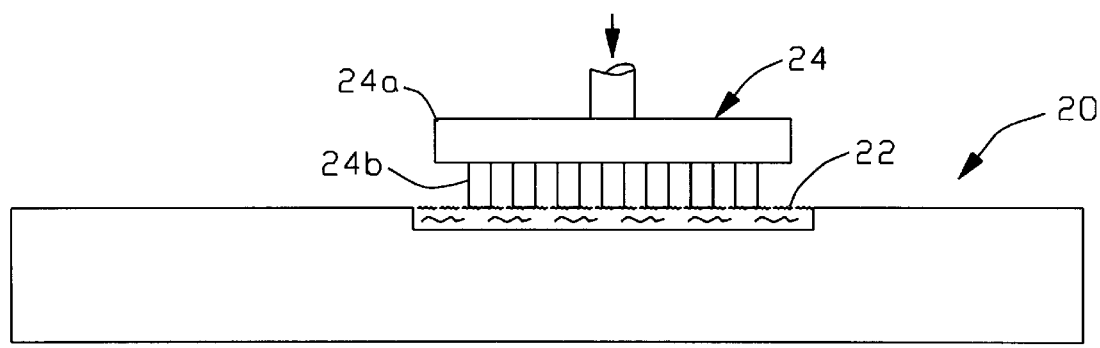
FIG. 6 shows a step in which the pins of a pin block are dipped into the solder flux in the stencil of FIG. 5.

Next, as is shown in FIG. 6, a pin block 24 is provided that has a base 24a from which multiple pins 24b project parallel to each other. These pins 24b have flat ends that match the pattern of the I/O pads 13 on the integrated circuit package 10; and those ends are set down in the indentation 21 of the stencil 20 which is filled with the solder flux 22.

Figure 7:
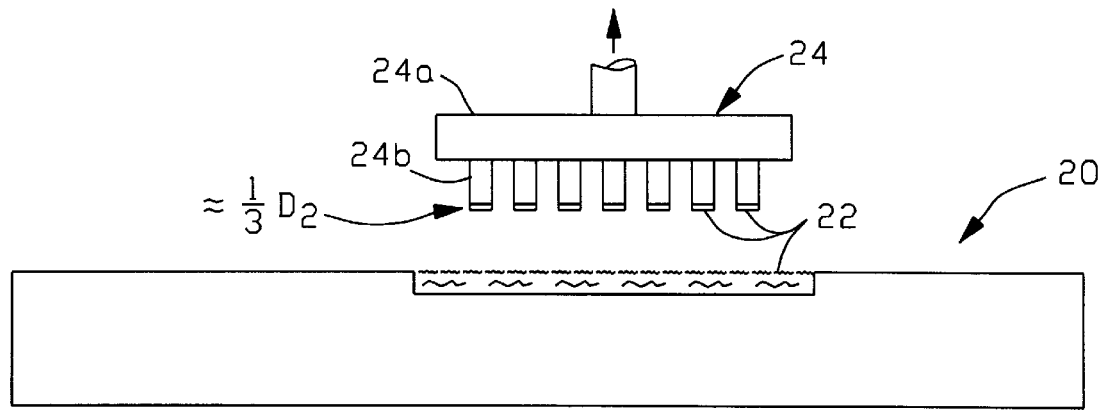
FIG. 7 shows a step in which the flux coated pins of the pin block are removed from the stencil of FIG. 6.

Thereafter, the ends of the pins on the pin block 24 are lifted out of the solder flux 22 as shown in FIG. 7. By these steps, the ends of the pins on the pin block 24 get coated with a film of the solder flux 22.

Figure 8:
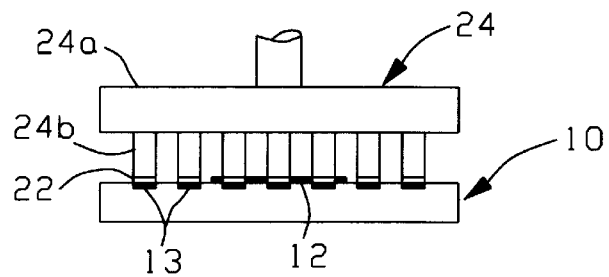
FIG. 8 shows a step in which the flux coated pins in the pin block of FIG. 7 are touched against the I/O pads in the integrated circuit package of FIG. 1.
Figure 9:
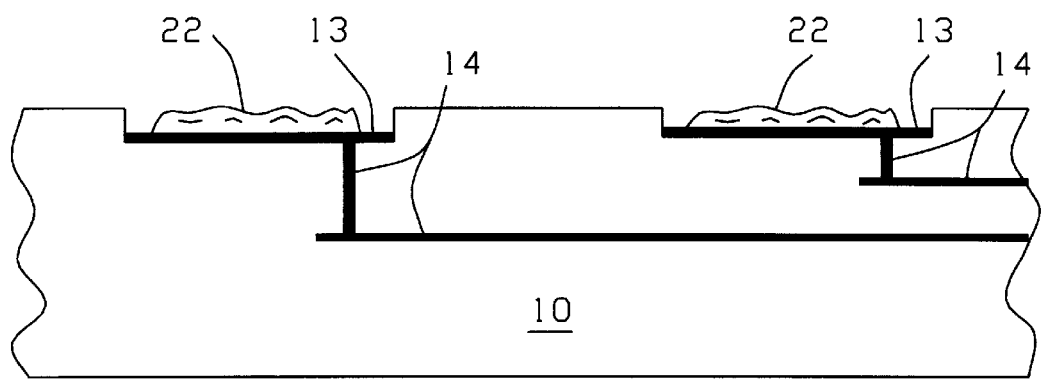
FIG. 9 is an enlarged sectional view, similar to FIG. 3, of the integrated circuit package which shows the solder flux that is dispensed on the I/O pads by the steps of FIGS. 5–8.

Next, as is shown in FIG. 8, the ends of the pins of the pin block 24 are moved into the recesses of the integrated circuit package 10 and temporarily touched against the I/O pads 13. This step transfers a portion of the solder flux from the ends of the pins on the pin block 24 onto the I/O pads 13. This is illustrated in FIG. 9 wherein the solder flux which is transferred to the I/O pads 13 is indicated by reference numeral 22.

By performing the above steps of FIGS. 3–9, a critical result which is achieved is that the lid 12, which projects above the I/O pads 13, does not interfere with the solder dispensing process. This result occurs because the pins 24b on the pin block 24 are long enough to hold the base 24a of the pin block above the lid 12 when the ends of pins touch the I/O pads 13.

Preferably, the amount of solder flux 22 which is transferred to the I/O pads 13 only partially fills the recesses in which the I/O pads lie by between 20% and 80%. As the recesses become more and more full, the risk increases that some flux will be pushed out of the recesses when the solder balls are placed on the I/O pads, and this in turn can short two I/O pads together when the solder balls are subsequently melted and resolidified. Conversely, if the amount of flux in the recesses is too small, then the solder balls will not properly fuse to the I/O pads 13, and thus an open circuit can occur.

By the steps of FIGS. 4–9, the recesses in which the I/O pads lie can be accurately filled part way with the solder flux 22. This accuracy is achieved by properly selecting the depth $D_2$ of the solder flux in the template 20 and its viscosity.

Preferably, the solder flux 22 has a viscosity at room temperature of about 250–350 poise, which is similar to the viscosity of Vaseline. In that case, the flux 20 which is transferred to the ends of the pins 24b by the step of FIG. 7 is about one-third as thick as the depth $D_2$ of the solder flux in the stencil 20; and, by the step of FIG. 8, about one-third of the solder flux on the ends of the pins 24b is transferred to the I/O pads 13.

To partially fill the recess by between 20% and 80%, the depth $D_2$ of the solder flux in template 20 should be selected such that $(\frac{1}{3})(\frac{1}{3})D_2$ is less than 80% $D_1$ and is more than 20% $D_1$. This is achieved by confining $D_2$ to be four to six times larger than the depth $D_1$ of the recessed I/O pads. In the above-described actual embodiment where $D_1$ is 0.003 inches, the depth $D_2$ was set at 0.015 inches.

Figure 10:
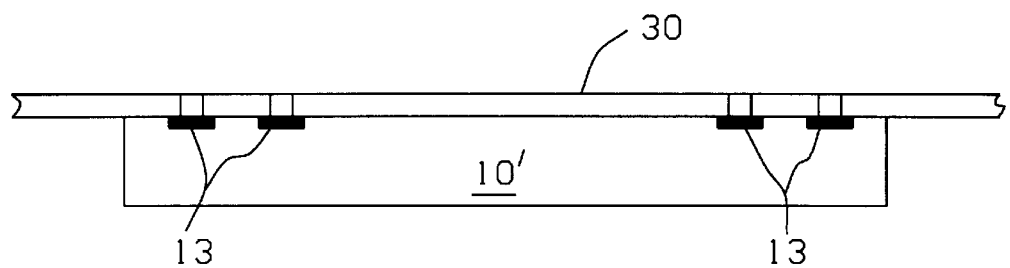
FIG. 10 shows a prior art integrated circuit package which contains no obstruction to the I/O pads and which is covered by a planer mask through which solder flux is pushed onto the I/O pads.

By comparison, for other types of electronic components in the prior art which do not have a lid that rises above the I/O pads 13, solder flux has been dispensed on the I/O pads by squeezing the solder flux with a squeegee through respective holes in a planar mask which lies flat on the component and exposes only the I/O pads. This is illustrated in FIG. 10 wherein the component is identified by reference numeral 10' and the mask is identified by reference numeral 30.

However, the use of the mask 30 will not work for the FIG. 1 component 10 because the lid 12 prevents the mask 30 from lying flat on the surface 10a around all of the I/O pads 13. This is illustrated in FIG. 11 which shows that due to the obstruction which the lid 12 presents, a gap 31 exists between the mask 30 and the component surface 10a.

Figure 11:
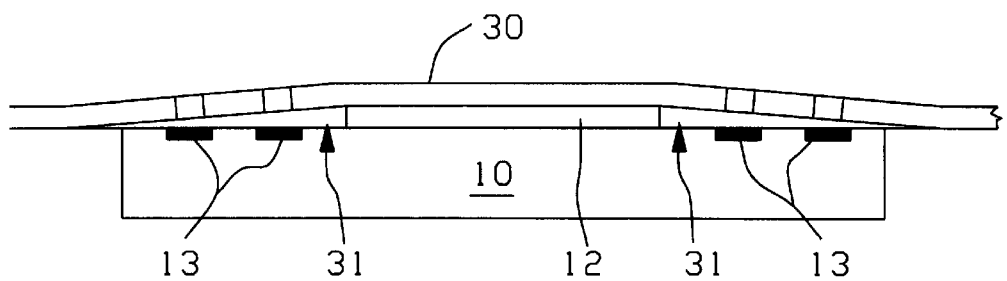
FIG. 11 shows that the planer mask of FIG. 10 will not work on the integrated circuit package of FIG. 1 because a lid obstructs the I/O pads.

If a squeegee is used to squeeze the solder flux 22 through the holes in the mask 30 of FIG. 11, that flux 22 will fill the gap 31 and bridge two or more adjacent I/O pads 13. Those I/O pads will subsequently become shorted together when solder balls are placed on them, melted, and resolidified. Also, the squeegee will bend and crease the mask 30 in FIG. 11 around the lid 12, and thus the mask 30 will not be reusable.

Also, another reason why the mask 30 will not work with the FIG. 1 component 30 is that the I/O pads 13 lie in recesses which are to be filled only part way with the solder flux 22. However, if the mask 30 is used, the recesses will be overfilled. This is because the flux 22 which is pushed through each hole in the mask 30 will fill the recess and will also fill each hole in the mask.

Figure 12:
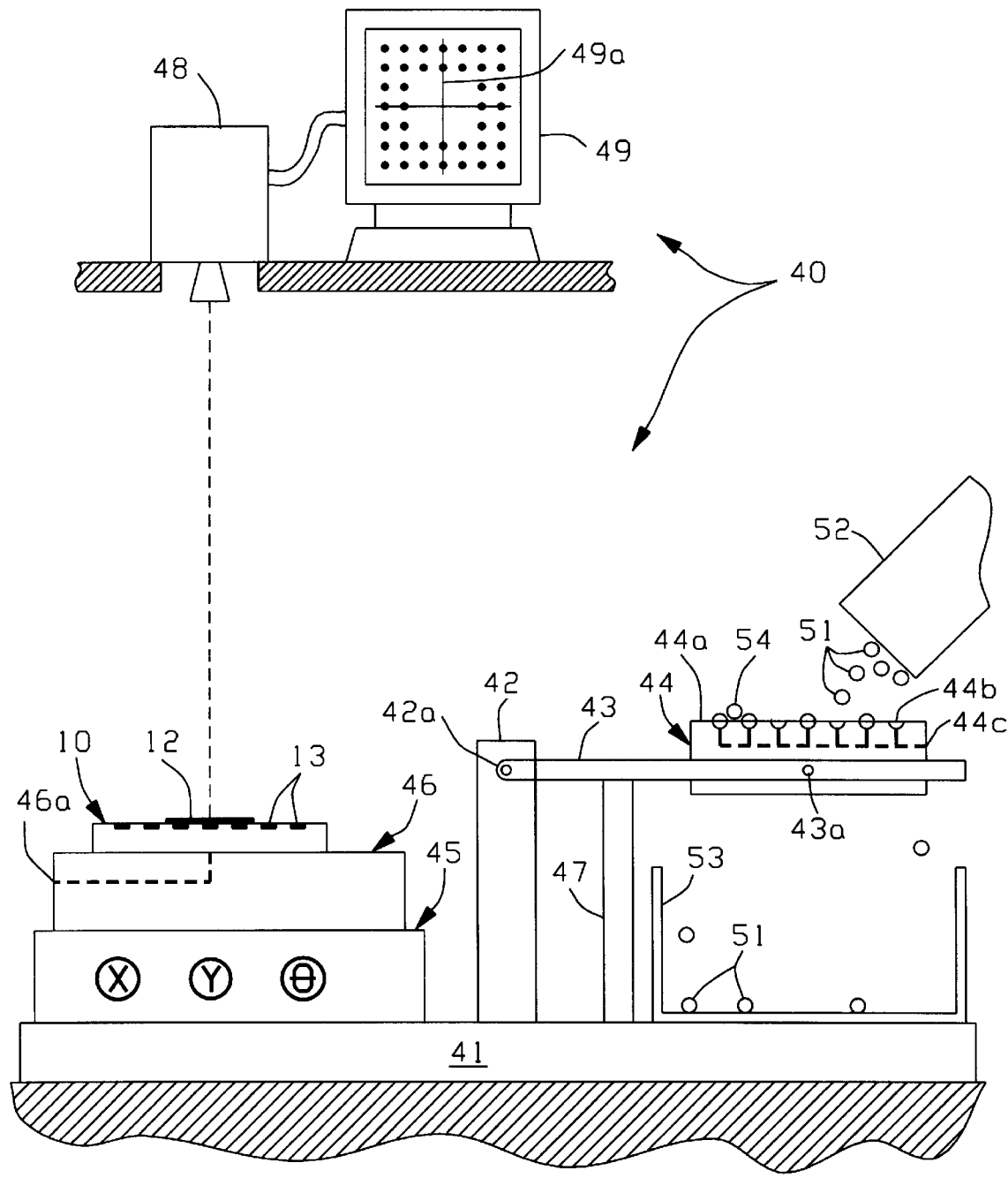
FIG. 12 shows an apparatus which places respective solder balls on each of the flux covered I/O pads on the integrated circuit package of FIG. 9.

After the solder flux 22 has been dispensed on the I/O pads 13 of the integrated package 10 by the steps of FIGS. 3–9, then solder balls are placed on the flux covered I/O pads by the steps of FIGS. 12–18. In FIG. 12, reference numeral 40 identifies an apparatus by which the steps of FIGS. 12–18 are carried out.

Included in the apparatus 40 are the following components: a flat base 41, a post 42 which extends perpendicular to the base, an arm 43 which pivots on the post at point 43a, a template 44 which pivots on the arm at point 43a, a position control mechanism 45 which moves a plate 46, a stop 47 for the arm 43, and a camera 48 which is coupled to a visual display 49. These components 41–49 are interconnected as shown in FIG. 12.

In operation, the integrated circuit package 10, with its flux coated I/O pads 13, is placed on the plate 46 where it is held in place by a vacuum which is applied to a vacuum channel 46a. Then, by using the X, Y, and θ control knobs on the position control mechanism 45, the plate 46 is moved left or right, forward or backward, and rotated in the horizontal plane. This positions the I/O pads 13 on the integrated circuit package 10 in alignment with cross hairs 49a on the visual display 49 as shown in FIG. 12.

Next, the pivot arm 43 is rested against the stop 47, and a face 44a of the template 44 is put in an upward position as is also shown in FIG. 12. That face 44a has multiple openings 44b which match the pattern of the I/O pads 13 on the integrated circuit package 10. Each opening 44b is funnel shaped and tapered from a diameter that is larger than a solder ball 51 to a diameter that is smaller than the solder ball.

Then, a plurality of solder balls 51 are poured from a container 52 onto the template face 44a; and a respective solder ball rolls into each of the openings 44b. At the same time, some excess solder balls roll off the template where they are caught in a tray 53; and some excess solder balls get trapped between the solder balls that fall into the template openings as is indicated by reference numeral 54.

Figure 13:
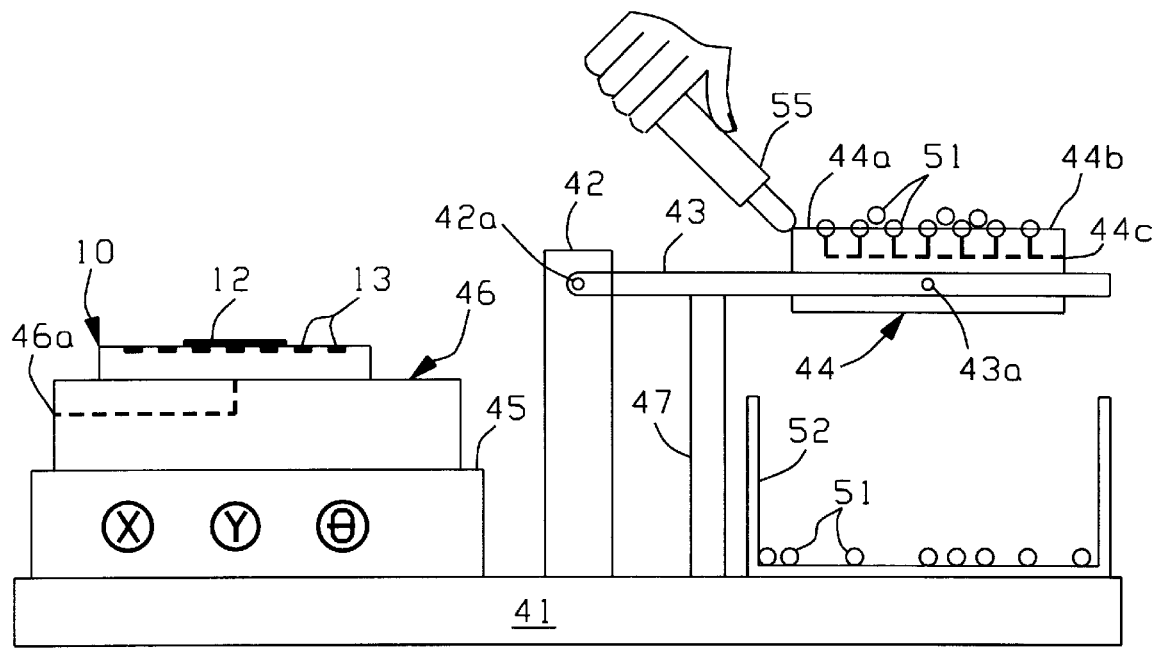
FIG. 13 shows a step in which a template, that is included within the apparatus of FIG. 12, is vibrated to thereby seat multiple solder balls which are held in respective holes in the template.

Next, as is shown in FIG. 13, the template 44 is vibrated by placing an electromechanical vibrator 55 against the template. One particular example of this vibrator 55 is model 11-11z by Ideal Industries, Inc. Preferably, the template 44 is vibrated for a time period of about five to fifteen seconds.

Due to the above step of vibrating the template 44, the solder balls 51 which are held in the template openings 44b become seated in those openings. That is, the solder balls 51 jostle around in the openings 44b and settle in a position where leaks between the surface of the solder balls 51 and the side walls of the template openings 44b become minimized. This is illustrated in FIGS. 14 and 15.

Figure 14:
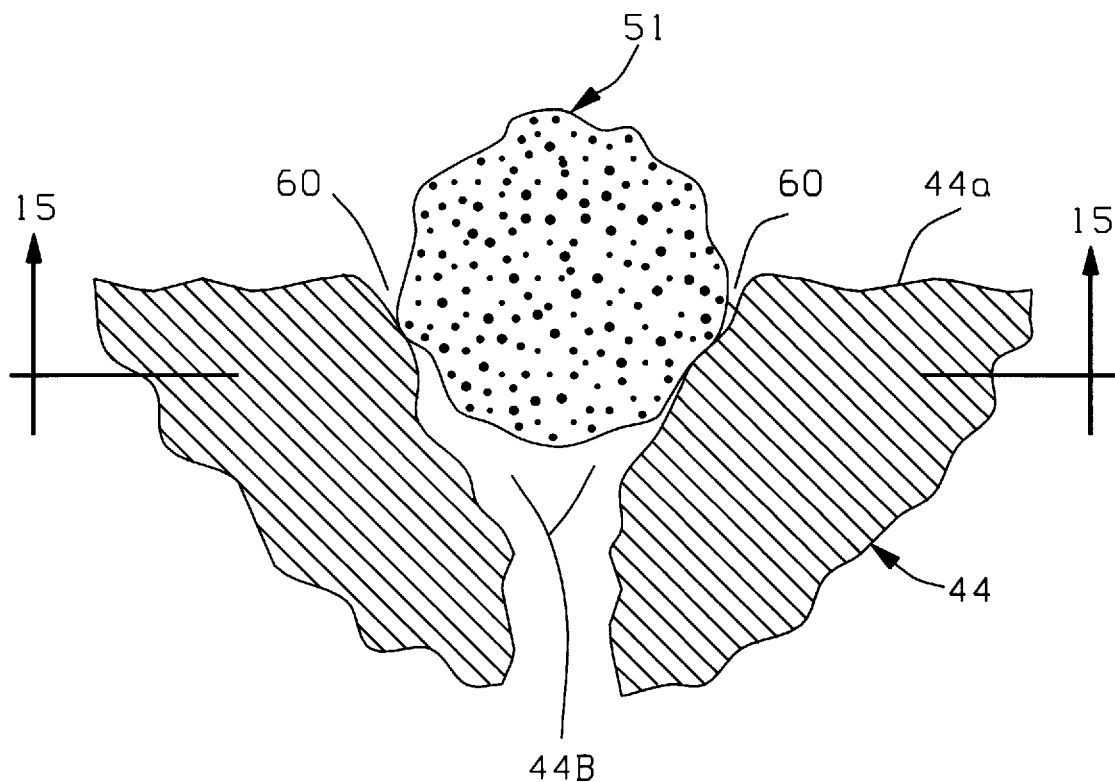
FIG. 14 is a greatly enlarged sectional view that is taken vertically through a single solder ball as it is held in an opening in the template of FIG. 13.
Figure 15:
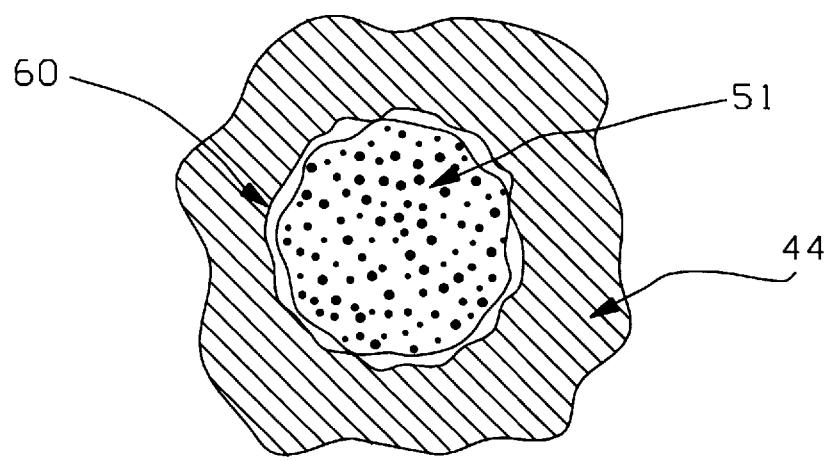
FIG. 15 is a horizontal sectional view, that is taken along lines 15—15 in FIG. 14, which shows how a vacuum leak past the solder balls on the template is greatly reduced by the vibrating step of FIG. 13.

In FIGS. 14 and 15, a single solder ball 51 and a single template opening 44b in which the solder ball lies are magnified many times. At this level of magnification, it can be seen that the surface of the solder ball 51 is irregular and out of round. Similarly, at this level of magnification, it can be seen that the side walls of the template opening 44b are rough and irregular.

Consequently, when a solder ball 51 rolls into a template opening 44b, an irregularly shaped unfilled space 60 will exist between the surface of the solder ball 51 and the side walls of the template opening 44b. Initially, the space 60 is relatively large in size. But, by vibrating the template 44, the solder ball 51 gets seated in the template opening 44b such that the size of the unfilled space 60 gets reduced and minimized.

All of the openings 44b in the template 44 are connected by a channel 44c to which a vacuum is applied after the above-described vibrating step. Alternatively, the vacuum can be applied to the channel 44c while the vibrating step is performed and continue to be applied after the vibrating step is completed.

Figure 16:
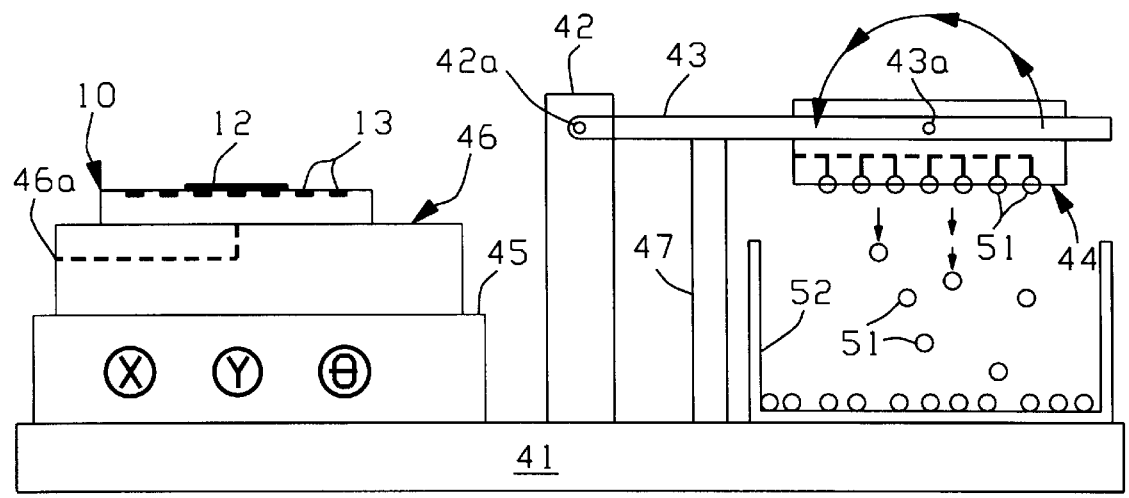
FIG. 16 shows a step in which the template of FIG. 13 is turned over to thereby remove excess solder balls from the template.

Then, while the vacuum is applied to the channel 44c, the template 44 is rotated 180° about point 43a on the arm 43 as shown in FIG. 16. During this step, all of the excess solder balls 51 fall off of the template 44, and the only solder balls which remain in the template are those which are held in the openings 44b by the vacuum that is applied to channel 44c.

By comparison, if the vibrating step of FIG. 13 is not performed, then all of the solder balls 51 will fall out of the template 44 when that template is rotated 180°. Thus the vibrating step of FIG. 13 is critical to the success of the process. If the template 44 is not vibrated, the vacuum leaks past the solder balls in the opening 44b will be so large that all of the solder balls drop out of the openings.

Figure 17:
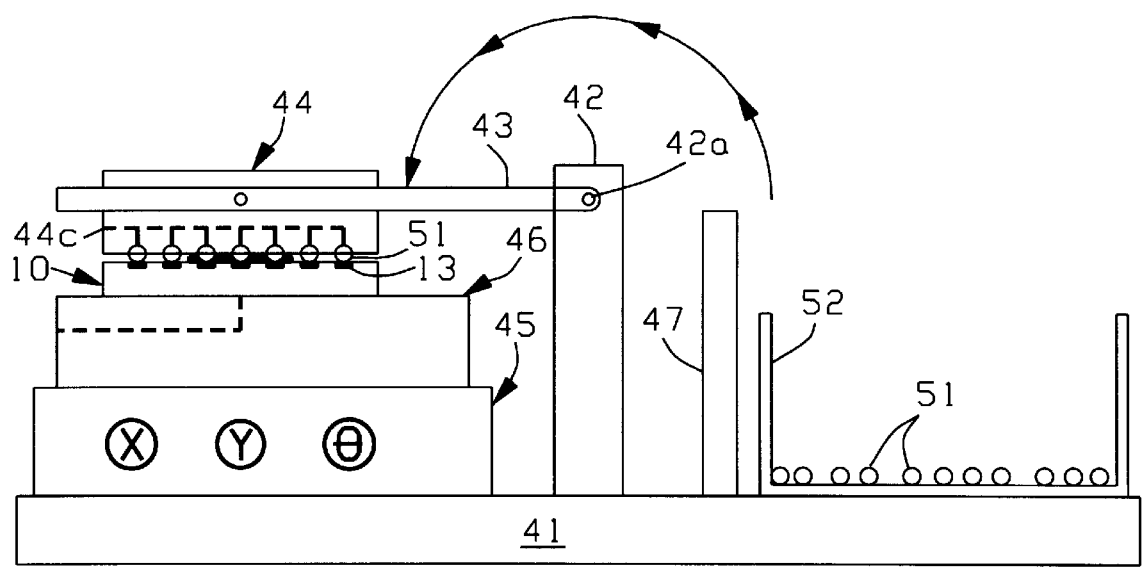
FIG. 17 shows a step in which the solder balls in the template holes are placed into alignment with the I/O pads on the integrated circuit package of FIG. 1.

Next, the template face 44a is again placed in an upward position by rotating the template 44 180° about point 43a on the arm 43; and then, the arm 43 is pivoted 180° in a counter clockwise direction about point 42a on the post 42. This step is shown in FIG. 17. By this step, the solder balls 51 in the template 44 are aligned directly with and placed on the I/O pads 13 of the integrated circuit package 10.

While the solder balls 51 and the I/O pads 13 are aligned as shown in FIG. 17, the vacuum is removed from the template channel 44c. Consequently, the solder balls 51 are released from the template 44 and are held only by the I/O pads 13 of the integrated circuit package 10. These solder balls are prevented from rolling on surface 10a off the I/O pads by the recesses in which the I/Os pad lie. Then the arm 43 is rotated clockwise 180° and rested against the stop 47 as shown in FIG. 18.

Figure 18:
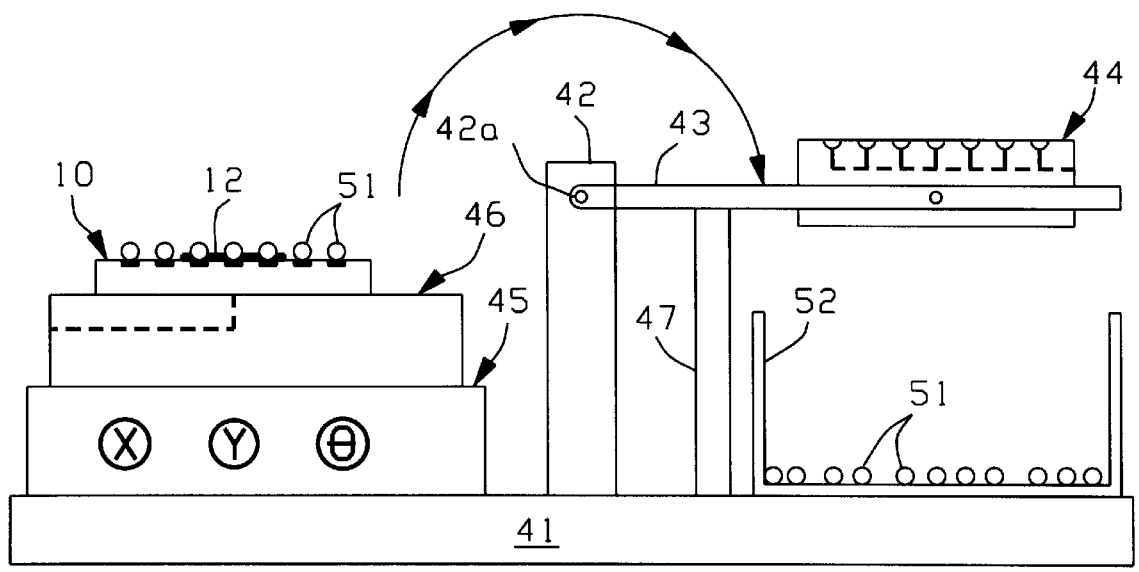
FIG. 18 shows a step in which the solder balls are released from the template and set onto the I/O pads of the integrated circuit package of FIG. 1.

Following the above step of FIG. 18, the integrated circuit package 10 is carefully lifted off the moveable plate 46, such that the solder balls 51 stay on the I/O pads 13, and placed in the belt furnace. There, the solder balls 51 are melted and resolidified which permanently attaches them to the I/O pads 13.

One preferred process for dispensing solder flux on the I/O pads been described in detent has now been described in detail; and in addition, one preferred process for placing solder balls on the flux covered I/O pads has also been described in detail. However, many changes and modifications can be made to the details of the above-described processes without departing from the nature and spirit of the invention.

For example, the I/O pads 13 can be arranged in any pattern on the integrated circuit package 10. Also, the recesses in which those I/O pads 13 lie can be any size. Preferably, package 10 has at least two-hundred I/O pads 13; and preferably the recesses are 0.5 mils to 5.0 mils (12.7 $\mu$m to 127 $\mu$m) deep and 5 mils to 50 mils (127 $\mu$m to 1270 $\mu$m) wide.

As another modification, the integrated circuit package 10 can have a different type of obstruction, other than the lid 12, which prevents a planar mask from lying flat on the surface 10a. Despite the nature of the obstruction, the pin block 24 can still be used to bypass the obstruction and dispense the solder flux on the I/O pads; and the template 44 can also still be used to place solder balls on the flux covered I/O pads.

As another modification, the body of the integrated circuit package 10 can be made with epoxy glass such as FR4 material. In this package, an obstruction for the I/O pads 13 can be formed by filling the cavity in which the integrated circuit chip 11 lies with a mound of epoxy which rises above the surface 10a.

As another modification, the pin block 24 can be used to dispense the solder flux on the I/O pads even when the integrated circuit package contains no obstruction to the I/O pads. Similarly, the pin block 24 can be used to dispense the solder flux on the I/O pads 13 even when the I/O pads lie flush on the surface 10a and not in respective recesses.

As another modification, the solder balls 51 which are placed on the I/O pads 13 can be any desired size. But, a practical range for the solder balls is 5 mils to 50 mils (127 to 1270 $\mu$m) in diameter.

As another modification, the openings 44b in the template 44 can have a variety of cross-sectional shapes. Preferably, however, those openings are funnel shaped and have side walls which are sloped 30° to 60° with respect to the horizontal plane. As the slope gets past 60°, the balls tend to stick in the template.

As another modification, the vibrating step of FIG. 13 can be performed by many different types of vibrators. In particular, the vibrator can be of a type which vibrates at just a single frequency such as 60 Hz; or the vibrator can be more complex and vibrate at multiple frequencies that are selectable or randomly generated.

Accordingly, the present invention is not limited by all of the details of the illustrated preferred process, but is defined by the appended claims.

What is claimed is:

1. A method of dispensing solder flux onto multiple I/O pads which are arranged in a pattern on a surface of an integrated circuit package; said method including the steps of:

providing a pin block that has a base from which multiple pins project with ends that match said pattern of I/O pads;

coating said ends of said pins with said solder flux; and, transferring a portion of said solder flux from said ends of said pins to said I/O pads by temporarily touching the coated ends of said pins against said I/O pads;

wherein said integrated circuit package includes an obstruction which projects above said surface and said I/O pads, and during said transferring step, said coated ends of said pins are moved past said obstruction and touched against said I/O pads without touching said obstruction.

2. A method according to claim 1 wherein said integrated circuit package includes an integrated circuit chip and said obstruction is a lid which covers said chip.

3. A method according to claim 1 wherein said integrated circuit package includes an integrated circuit chip and said obstruction is an epoxy encapsulant which covers said chip.

4. A method of dispensing solder flux onto multiple I/O pads which are arranged in a pattern on a surface of an integrated circuit package; said method including the steps of:

providing a pin block that has a base from which multiple pins project with ends that match said pattern of I/O pads;

coating said ends of said pins with said solder flux; and, transferring a portion of said solder flux from said ends of said pins to said I/O pads by temporarily touching the coated ends of said pins against said I/O pads;

wherein said surface of said integrated circuit package has multiple recesses in which said I/O pads respectively lie, and during said transferring step, said coated ends of said pins are moved into said recesses and touched against said I/O pads.

5. A method according to claim 4 wherein said portion of said solder flux which is transferred from said ends of said pins to said I/O pads only partially fills said recesses by more than 20% and less than 80%.

6. A method according to claim 4 wherein said integrated circuit package includes an obstruction which prevents a planar mask from lying flat on said surface, and during said transferring step, said coated ends of said pins are moved past said obstruction and touched against said I/O pads without touching said obstruction.

7. A method according to claim 4 wherein said recesses are one-half to five mils in depth.

8. A method according to claim 5 wherein said recesses are five mils to fifty mils across.

9. A method according to claim 4 wherein said solder flux has a viscosity which, at room temperature, is about 250–300 poise.

10. A method according to claim 4 wherein said I/O pads total at least two-hundred.

11. A method according to claim 4 wherein said ends of said pins are flat.

12. A method according to claim 4 wherein said integrated circuit package has a ceramic body which holds said I/O pads.

13. A method according to claim 1 wherein said integrated circuit package has an epoxy glass body which holds said I/O pads.

* * * * *